United States Patent
Lee et al.

(10) Patent No.: US 9,644,272 B2
(45) Date of Patent: May 9, 2017

(54) THIN FILM DEPOSITION APPARATUS AND METHOD OF MANUFACTURING ORGANIC LIGHT-EMITTING DISPLAY APPARATUS BY USING THE SAME

(71) Applicant: Samsung Display Co., Ltd., Yongin, Gyeonggi-Do (KR)

(72) Inventors: Suhwan Lee, Yongin (KR); Eunho Kim, Yongin (KR); Muhyun Kim, Yongin (KR)

(73) Assignee: Samsung Display Co., ltd., Gyeonggi-do (KR)

( * ) Notice: Subject to any disclaimer, the term of this patent is extended or adjusted under 35 U.S.C. 154(b) by 46 days.

(21) Appl. No.: 14/584,190

(22) Filed: Dec. 29, 2014

(65) Prior Publication Data
US 2016/0006001 A1    Jan. 7, 2016

(30) Foreign Application Priority Data
Jul. 7, 2014  (KR) .................. 10-2014-0084622

(51) Int. Cl.
| | | |
|---|---|---|
| H01L 51/56 | (2006.01) | |
| C23C 16/54 | (2006.01) | |
| C23C 14/04 | (2006.01) | |
| C23C 14/56 | (2006.01) | |
| H01L 51/00 | (2006.01) | |

(52) U.S. Cl.
CPC .......... C23C 16/545 (2013.01); C23C 14/042 (2013.01); C23C 14/56 (2013.01); H01L 51/0011 (2013.01)

(58) Field of Classification Search
CPC .................. H01L 51/56; H01L 51/44
See application file for complete search history.

(56) References Cited

U.S. PATENT DOCUMENTS

| | | | |
|---|---|---|---|
| 2010/0297349 A1 | 11/2010 | Lee et al. | |
| 2011/0053300 A1 | 3/2011 | Ryu et al. | |
| 2011/0168986 A1* | 7/2011 | Lee ............... | C23C 14/042 257/40 |
| 2011/0186820 A1* | 8/2011 | Kim ............... | C23C 14/044 257/40 |
| 2012/0174865 A1* | 7/2012 | Choi .............. | C23C 14/12 118/720 |

FOREIGN PATENT DOCUMENTS

| | | |
|---|---|---|
| JP | 2008-248301 A | 10/2008 |
| KR | 10-2010-0133679 A | 12/2010 |
| KR | 10-2011-0021623 A | 3/2011 |
| KR | 10-2012-0125586 A | 11/2012 |

\* cited by examiner

*Primary Examiner* — Mamadou Diallo
(74) *Attorney, Agent, or Firm* — Knobbe Martens Olson & Bear LLP (57) ABSTRACT

Disclosed is a thin film deposition apparatus and a method of manufacturing an organic light-emitting display apparatus by using the thin film deposition apparatus. The thin film deposition apparatus and the method of manufacturing the organic light-emitting display apparatus using the thin film deposition apparatus reduce manufacturing time and cost.

5 Claims, 6 Drawing Sheets

THIN FILM DEPOSITION APPARATUS AND METHOD OF MANUFACTURING ORGANIC LIGHT-EMITTING DISPLAY APPARATUS BY USING THE SAME

RELATED APPLICATION

This application claims the benefit of Korean Patent Application No. 10-2014-0084622, filed on Jul. 7, 2014, in the Korean Intellectual Property Office, the disclosure of which is incorporated herein in its entirety by reference.

BACKGROUND

1. Field

One or more embodiments of the present invention relate to a thin film deposition apparatus and a method of manufacturing an organic light-emitting display apparatus by using the thin film deposition apparatus.

2. Description of the Related Art

Organic light-emitting display devices have wider viewing angles, better contrast characteristics, and faster response speeds than other display devices, and thus have drawn attention as next-generation display devices.

An organic light-emitting display device includes intermediate layers (including an emission layer) disposed between a first electrode and a second electrode. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when a large mask is used, the mask may bend due to the weight thereof, thereby distorting a pattern. Such disadvantages are not conducive to the recent trend towards a high-definition pattern.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section is known to the inventors of the present invention before achieving the present invention or is technical information acquired in the process of achieving the present invention. As such, the foregoing discussions are to provide general background information and do not constitute an admission of the prior art.

SUMMARY

One aspect of the invention provides a thin film deposition apparatus for forming a thin film on a substrate, the thin film deposition apparatus comprising: a deposition source configured to contain a deposition material; a deposition source nozzle unit disposed at one side of the deposition source and comprising a plurality of deposition source nozzles; and a mask disposed to face the deposition source, and comprising a plurality of patterning slits through which the deposition material passes to be deposited onto a substrate to form a plurality of sub-pixels, wherein the plurality of patterning slits comprise a first patterning slit through which the deposition material passes for forming a first one of the plurality of sub-pixels, a second patterning slit through which the deposition material passes for forming a second one of the plurality of sub-pixels, and a third patterning slit through which the deposition material passes for forming a third one of the plurality of sub-pixels, and wherein the first patterning slit has a first length extending along the moving direction, and the second patterning slit has a second length extending along the moving direction and substantially different from the first length.

In the foregoing apparatus, the mask may comprise a first sheet comprising a plurality of uniform slits having a substantially same length and a second sheet comprising a hole having a contour, the second sheet overlapping the first sheet and configured to block a portion of each of the uniform slits such that the first sheet and the second sheet collectively form the first, second and third patterning slits. The second sheet may comprise a first shielding unit configured to shield at least a part of a first one of the uniform slits, a second shielding unit configured to shield at least a part of a second one of the uniform slits, and a third shielding unit configured to shield at least a part of a third one of the uniform slits.

Still in the foregoing apparatus, the mask may comprise a single sheet comprising the first patterning slit, the second patterning slit, and the third patterning slit. The first sub-pixel may comprise an intermediate layer comprising an organic emission layer configured to emit red light, the second sub-pixel comprises an intermediate layer comprising an organic emission layer configured to emit green light, and the third sub-pixel comprises an intermediate layer comprising an organic emission layer configured to emit blue light. The first length may be greater than the second length. The third patterning slit has a third length extending along the moving direction, wherein the second length may be greater than the third length.

Yet in the foregoing apparatus, the plurality of patterning slits may comprise an additional first patterning slit spaced apart from the first patterning slit, wherein the first patterning slit is located closer to a center of the mask than the additional, first patterning slit which is longer than the first patterning slit. The plurality of patterning slits may comprise an additional second patterning slit spaced apart from the second patterning slit, wherein the second patterning slit is located closer to a center of the mask than the additional second patterning slit which is longer than the second patterning slit. The plurality of patterning slits may comprise an additional third patterning slit spaced apart from the third patterning slit, wherein the third patterning slit may be located closer to a center of the mask than the additional third patterning slit which is longer than the third patterning slit.

Further in the foregoing apparatus, at least one end of each of the first patterning slit, the second patterning slit, and the third patterning slit may be formed in a circular arc or cosine curve shape. An amount of the deposition material to be deposited on the substrate may be controlled according to the length of each of the first through third patterning slits. One of the thin film deposition apparatus or the substrate moves relative to the other.

Another aspect of the invention provides a method of manufacturing an organic light-emitting display device, the method comprising: providing a thin film deposition apparatus; positioning a substrate such that the substrate is spaced apart from the thin film deposition apparatus; and depositing a deposition material onto the substrate by discharging the deposition material from the thin film deposition apparatus onto the substrate while moving one of the thin film deposition apparatus or the substrate relative to the other along a moving direction, wherein the depositing of the deposition material discharged from the thin film deposition apparatus onto the substrate comprises: depositing the deposition material through a plurality of patterning slits onto the substrate to form a plurality of sub-pixels, each of which corresponds to one of the plurality of patterning slits, wherein the plurality of patterning slits comprise a first patterning slit through which the deposition material passes for forming a first one of the plurality of sub-pixels, a second patterning slit through which the deposition material passes for forming a second one of the plurality of sub-pixels, and a third patterning slit through which the deposition material passes for forming a third one of the plurality of sub-pixels, and wherein the first patterning slit has a first length extending along the moving direction, and the second patterning slit has a second length extending along the moving direction and substantially different from the first length.

In the foregoing method, the first sub-pixel may comprise an intermediate layer comprising an organic emission layer that is configured to emit red light, the second sub-pixel comprises an intermediate layer comprising an organic emission layer that is configured to emit green light, and the third sub-pixel comprises an intermediate layer comprising an organic emission layer that is configured to emit blue light. The third patterning slit has a third length extending along the moving direction, wherein the first length may be greater than the second length which is greater than the third length. The plurality of patterning slits may comprise an additional first patterning slit for forming another first sub-pixel, an additional second patterning slit for forming another second subpixel, and an additional third patterning slit for forming another third sub-pixel, wherein the first, second and third patterning slits are located closer to a center of a patterning slit sheet comprising the plurality of patterning slits than the additional first, second and third patterning slits, respectively, and the first, second and third patterning slits are shorter than the additional first, second and third patterning slits, respectively. An amount of the deposition material deposited on the substrate is controlled according to the length of each of the first through third patterning slits.

One or more embodiments of the present invention include a thin film deposition apparatus and a method of manufacturing an organic light-emitting display apparatus by using the thin film deposition apparatus.

Additional aspects will be set forth in part in the description which follows and, in part, will be apparent from the description, or may be learned by practice of the presented embodiments.

According to one or more embodiments of the present invention, a thin film deposition apparatus for forming a thin film on a substrate includes: a deposition source for discharging deposition materials; a deposition source nozzle unit disposed at one side of the deposition source and including a plurality of deposition source nozzles; and a patterning slit sheet disposed to face the deposition source, and including a plurality of patterning slits through which the deposition materials to be deposited onto a plurality of sub-pixels that form a pixel pass, wherein the plurality of patterning slits include a first patterning slit through which deposition materials that form a first sub-pixel pass, a second patterning slit through which deposition materials that form a second sub-pixel pass, and a third patterning slit through which deposition materials that form a third sub-pixel pass, and wherein at least two of a length of a passage area of the first patterning slit through which the deposition materials that form the first sub-pixel pass, a length of a passage area of the second patterning slit through which the deposition materials that form the second sub-pixel pass, and a length of a passage area of the third patterning slit through which the deposition materials that form the third sub-pixel pass are differently formed.

At least two of a length of the first patterning slit, a length of the second patterning slit, and a length of the third patterning slit may be differently formed such that the at least two of the length of the passage area of the first patterning slit through which the deposition materials that form the first sub-pixel pass, the length of the passage area of the second patterning slit through which the deposition materials that form the second sub-pixel pass, and the length of the passage area of the third patterning slit through which the deposition materials that form the third sub-pixel pass are differently formed.

The thin film deposition apparatus may further include: a correction plate disposed between the deposition source nozzle unit and the patterning slit sheet and for blocking at least a part of the deposition materials discharged from the deposition source, wherein the correction plate shields at least a part of the plurality of patterning slits such that the at least two of the length of the passage area of the first patterning slit through which the deposition materials that form the first sub-pixel pass, the length of the passage area of the second patterning slit through which the deposition materials that form the second sub-pixel pass, and the length of the passage area of the third patterning slit through which the deposition materials that form the third sub-pixel pass are differently formed.

The first sub-pixel may include an intermediate layer including an organic emission layer that emits red light, the second sub-pixel includes an intermediate layer including an organic emission layer that emits green light, and the third sub-pixel includes an intermediate layer including an organic emission layer that emits blue light.

The length of the passage area of the first patterning slit through which the deposition materials that form the first sub-pixel pass may be greater than the length of the passage area of the second patterning slit through which the deposition materials that form the second sub-pixel pass.

The length of the passage area of the second patterning slit through which the deposition materials that form the second sub-pixel pass may be greater than the length of the passage area of the third patterning slit through which the deposition materials that form the third sub-pixel pass.

The at least one first patterning slit may be a plurality of first patterning slits which are spaced apart from each other, wherein each of the plurality of first patterning slits is spaced further apart from a center of the patterning slit sheet as length of a passage area increases.

The second patterning slit may include a plurality of second patterning slits which are spaced apart from each other, wherein the greater the lengths of passage areas of the plurality of second patterning slits, the farther away from a center the patterning slit sheet.

The third patterning slit may include a plurality of third patterning slits which are spaced apart from each other, wherein the greater the lengths of passage areas of the plurality of third patterning slits, the farther away from a center the patterning slit sheet.

At least one of one end of the passage area of the first patterning slit, one end of the passage area of the second patterning slit, and one end of the passage area of the third patterning slit may be formed in a circular arc or cosine curve shape.

An amount of the deposition materials deposited on the substrate may be controlled according to the length of the passage area of each of the first through third patterning slits.

The correction plate may include a plurality of first patterning slit shielding units that shield at least a part of the first patterning slit, and are spaced apart from each other, wherein each of the plurality of first patterning slit shielding units is spaced further apart from a center of the patterning slit sheet as length of a passage area is increased.

The correction plate may include a plurality of second patterning slit shielding units that shield at least a part of the second patterning slit, and are spaced apart from each other, wherein the greater the lengths of passage areas of the plurality of second patterning slit'shielding units, the farther away from a center the patterning slit sheet.

The correction plate may include a plurality of third patterning slit shielding units that shield at least a part of the third patterning slit, and are spaced apart from each other, wherein the greater the lengths of passage areas of the plurality of third patterning slit shielding units, the farther away from a center the patterning slit sheet.

One of the thin film deposition apparatus or the substrate may move relative to the other.

According to one or more embodiments of the present invention, a method of manufacturing an organic light-emitting display device by using a thin film deposition apparatus for forming a thin film on a substrate includes: positioning the substrate such that the substrate is spaced apart from the thin film deposition apparatus; and depositing deposition materials onto the substrate by discharging the deposition materials from the thin film deposition apparatus onto the substrate while moving one of the thin film deposition apparatus or the substrate relative to the other, wherein the depositing of the deposition materials discharged from the thin film deposition apparatus onto the substrate includes: depositing the deposition materials, through a plurality of patterning slits, onto a plurality of sub-pixels that form a pixel, wherein the plurality of patterning slits include a first patterning slit through which deposition materials that form a first sub-pixel pass, a second patterning slit through which deposition materials that form a second sub-pixel pass, and a third patterning slit through which deposition materials that form a third sub-pixel pass, and wherein at least two of a length of a passage area of the first patterning slit through which the deposition materials form the first sub-pixel pass, a length of a passage area of the second patterning slit through which the deposition materials that form the second sub-pixel pass, and a length of a passage area of the third patterning slit through which the deposition materials that form the third sub-pixel pass are differently formed.

The first sub-pixel may include an intermediate layer including an organic emission layer that emits red light, the second sub-pixel includes an intermediate layer including an organic emission layer that emits green light, and the third sub-pixel includes an intermediate layer including an organic emission layer that emits blue light.

The length of the passage area of the first patterning slit through which the deposition materials form the first sub-pixel pass may be greater than the length of the passage area of the second patterning slit through which the deposition materials that form the first sub-pixel pass, or the length of the passage area of the second patterning slit through which the deposition materials form the second sub-pixel pass is greater than the length of the passage area of the third patterning slit through which the deposition materials that form the third sub-pixel pass.

The at least one first patterning slit may be a plurality of first patterning slits, the at least one second patterning slit may be a plurality of second patterning slits, and the at least one third patterning slit may be a plurality of third patterning slits, wherein at least one of lengths of passage areas of the plurality of first patterning slits, lengths of passage areas of the plurality of second patterning slits, and lengths of passage areas of the plurality of third patterning slits increases from a center of the patterning slit sheet to the outside.

An amount of the deposition materials deposited on the substrate may be controlled according to the length of the passage area of each of the first through third patterning slits.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 1:
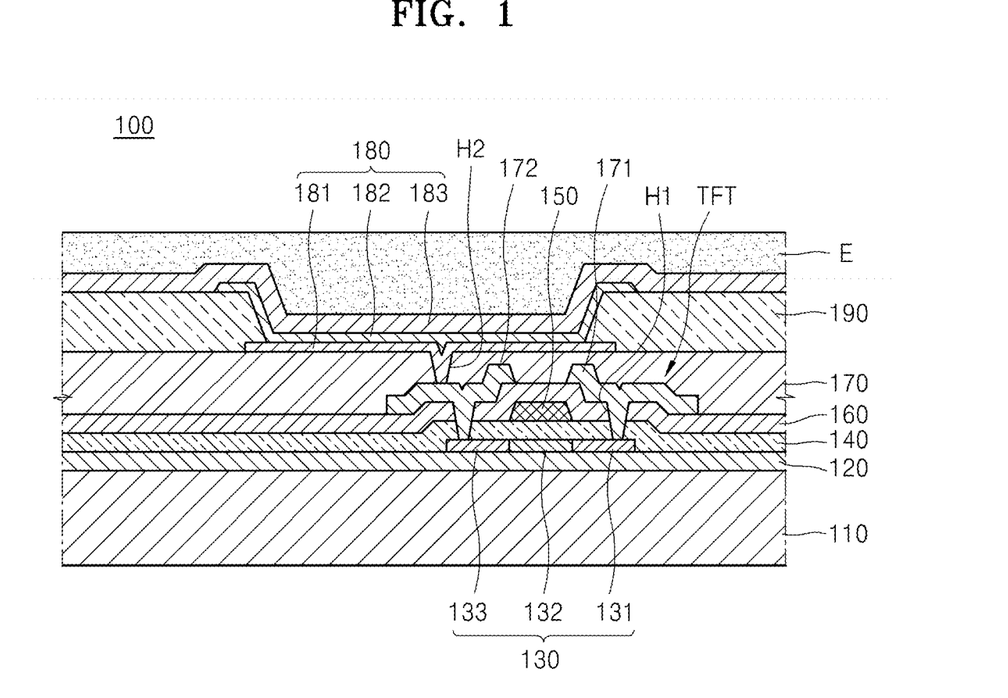
FIG. 1 is a cross-sectional view of a sub-pixel of an organic light-emitting display apparatus according to an embodiment of the present invention.
Figure 2:
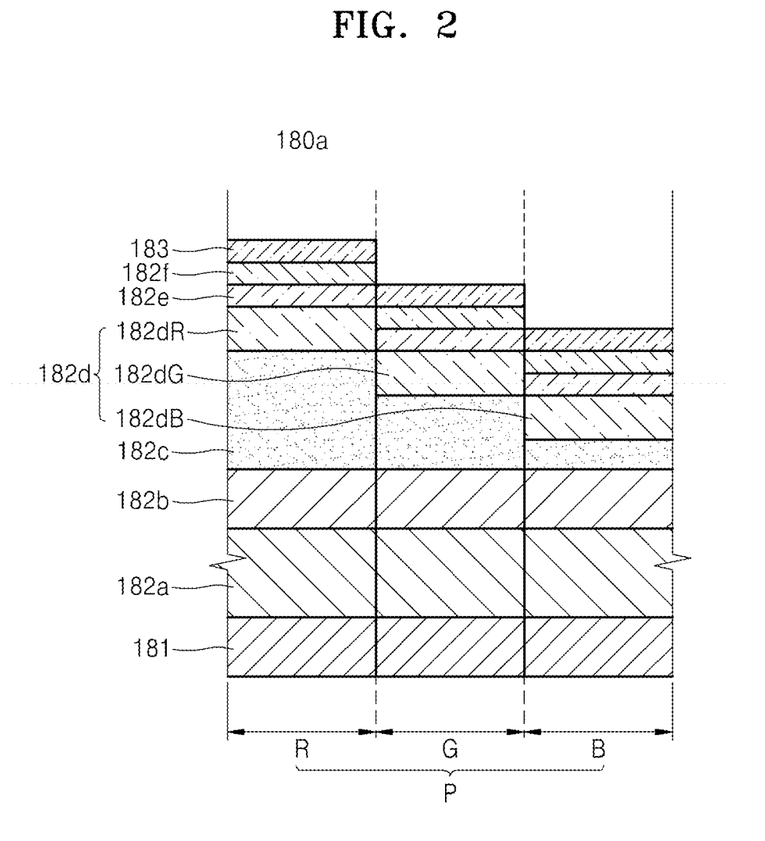
FIG. 2 is a cross-sectional view for comparing relative thicknesses of pixels of an organic light-emitting display apparatus of FIG. 1.

FIG. 1 is a cross-sectional view of a sub-pixel of an organic light-emitting display apparatus 100 according to an embodiment of the present invention. FIG. 2 is a cross-sectional view for comparing relative thicknesses of pixels of an organic light-emitting display apparatus 100 of FIG. 1.

Referring to FIGS. 1 and 2, the organic light-emitting display apparatus 100 may include a first substrate 110 and an emission unit. The organic light-emitting display apparatus 100 may include a thin film encapsulation layer E formed on the emission unit or a second substrate. In this regard, the second substrate is the same as or similar to that used in a general organic light-emitting display apparatus, and thus a detailed description thereof is omitted. For convenience of description, the thin film encapsulation layer E of the organic light-emitting display apparatus 100 will be described in more detail below.

The emission unit may be formed on the first substrate 110. In this regard, the emission unit may include a thin film transistor TFT. A passivation layer 170 covering the emission unit and the thin film transistor TFT may be formed. An organic light-emitting device (OLED) 180 may be formed on the passivation layer 170.

In this regard, the first substrate 110 may use a glass material but is not limited thereto. The first substrate 110 may use a plastic material and a metal material such as stainless steel and Ti. The first substrate 10 may use polyimide (PI). For convenience of description, a case where the first substrate 110 uses the glass material will be described in more detail below.

A buffer layer 120 formed of an organic compound and/or an inorganic compound is further formed on the first substrate 110, and may be formed of SiOx (x≥1) and SiNx (x≥1).

An active layer 130 in a predetermined pattern is formed on the buffer layer 120 and then is buried by a gate insulating layer 140. The active layer 130 includes a source area 131 and a drain area 133 and further a channel area 132 therebetween.

The active layer 130 may be formed to contain various materials. For example, the active layer 130 may contain an inorganic semiconductor material such as amorphous silicon or crystalline silicon. As another example, the active layer 130 may contain an oxide semiconductor. As another example, the active layer 130 may contain an organic semiconductor material. However, for convenience of description, a case where the active layer 130 is formed of the amorphous silicon will be described in more detail below.

The active layer 130 may be formed by forming an amorphous silicon layer on the buffer layer 120, crystallizing the amorphous silicon layer, forming a polycrystalline silicon layer, and patterning the polycrystalline silicon layer. The source area 131 and the drain area 133 of the active layer 130 may be doped with impurities according to a type of the thin film transistor TFT such as a driving thin film transistor TFT, a switching thin film transistor TFT, etc.

A gate electrode 150 corresponding to the active layer 130 and an interlayer insulating layer 160 burying the gate electrode 150 are formed on the gate insulating layer 140.

The interlayer insulating layer 160 and the gate insulating layer 140 are formed in a contact hole H1, and then a source electrode 171 and a drain electrode 172 are formed on the interlayer insulating layer 160 such that the source electrode 171 and the drain electrode 172 may respectively contact the source area 131 and the drain area 133.

The passivation layer 170 is formed on the thin film transistor TFT formed above. A pixel electrode 181 of the OLED 180 is formed on the passivation layer 170. The pixel electrode 181 contacts the drain electrode 172 of the thin film transistor TFT by a via hole H2 formed in the passivation layer 170. The passivation layer 170 may be formed of an inorganic material and/or an organic material and may have a single layer or two or more layer structure. The passivation layer 170 may be formed as a planarization layer to make an upper surface thereof planar irrespective of a curve of a layer of a lower portion, whereas the passivation layer 170 may be formed to be curved along the curve of the layer of the lower portion. The passivation layer 170 may be formed as a transparent insulator so as to achieve a resonance effect.

After the pixel electrode 181 is formed on the passivation layer 170, a pixel defining layer 190 is formed of an organic material and/or an inorganic material so as to cover the pixel electrode 181 and the passivation layer 170, and is open such that the pixel electrode 181 is exposed.

An intermediate layer 182 and a facing electrode 183 are formed on at least the pixel electrode 181.

The pixel electrode 181 functions as an anode and the facing electrode 183 functions as a cathode. The polarities of the pixel electrode 181 and the facing electrode 183 may also be switched.

The pixel electrode 181 and the facing electrode 183 are insulated from each other by the intermediate layer 182. An organic emission layer 182d emits light by applying voltages having different polarities to the intermediate layer 182.

The intermediate layer 182 includes the organic emission layer 182d. In another example, the intermediate layer 182 includes the organic emission layer 182d and may further include at least one of a hole injection layer (HIL) 182a, a hole transport layer (HTL) 182b, an electron transport layer (ETL) 182e, and an electron injection layer (EIL) 182f. However, the present embodiment is not limited thereto, and the intermediate layer 182 includes the organic emission layer 182d and may further include other various functional layers 182c. In this regard, the functional layers 182c may be formed in various ways. For example, the functional layers 182c may include an emission supplemental layer that supplements emission. The functional layers 182c may include an auxiliary layer that may increase emission efficiency, color purity, etc. In this regard, the auxiliary layer may be formed of the same material as that of the HTL 182b.

In the meantime, a unit pixel P includes a plurality of sub-pixels R, G, and B that may emit lights of various colors. For example, the sub-pixels R, G, and B may emit lights of red, green, and blue colors, respectively. In embodiments, the sub-pixels may emit lights of red, green, blue, and white colors.

The sub-pixels R, G, and B may include the intermediate layer 182 including organic emission layers that emit lights of various colors. For example, each of the sub-pixels R, G, and B includes the intermediate layer 182 including the organic emission layers that emit lights of red, green, and blue colors. However, for convenience of description, the first sub-pixel R that emits red light, the second sub-pixel G that emits green light, and the third sub-pixel B that emits blue light will be described in detail below. For convenience of description, a case where the first sub-pixel R includes a first intermediate layer including a first organic emission layer 182d-R that emits the red light, the second sub-pixel G includes a second intermediate layer including a second organic emission layer 182d-G that emits the green light, and the third sub-pixel B includes a third intermediate layer including a third organic emission layer 182d-B that emits the blue light will be described in detail below.

The first intermediate layer, the second intermediate layer, and the third intermediate layer may be formed to have different thicknesses. For example, at least two of the first intermediate layer, the second intermediate layer, and the third intermediate layer may have different thicknesses. In particular, a thickness of the first intermediate layer may be greater than that of the second intermediate layer. A thickness of the second intermediate layer may be greater than that of the third intermediate layer. In this regard, such different thicknesses may correct an optical thickness of each sub-pixel.

A method of correcting the optical thickness may be performed in various ways. For example, thicknesses of layers that are commonly shared by the first through third intermediate layers may be differently formed or the functional layers 182c may be formed in lower sides of the first through third organic emission layers 182d-R, 182d-G, and 182d-B. However, for convenience of description, a case where thicknesses of the functional layers 182c that are commonly shared by the first through third intermediate layers may be differently formed will be described in detail below.

In the meantime, the thin film encapsulation layer E may include a plurality of inorganic layers or an inorganic layer and an organic layer.

The organic layer of the thin film encapsulation layer E may be formed of polymer, and may be a single layer or a layer stack formed of any one of polyethylene terephthalate, polyimide, polycarbonate, epoxy, polyethylene, and polyacrylate. The organic layer may be formed of polyacrylate, and in detail, may include a polymerized monomer composition including diacrylate-based monomer and triacrylate-based monomer. The monomer composition may further include monoacrylate-based monomer. Also, the monomer composition may further include a well-known photoinitiator such as trimethyl benzoyl diphenyl phosphine oxide (TPO), but embodiments of the present invention are not limited thereto.

The inorganic layer of the thin film encapsulation layer E may be a single layer or a layer stack including a metal oxide or a metal nitride. In detail, the inorganic layer may include any one of SiNx, $Al_2O_3$, $SiO_2$, and $TiO_2$. The top layer of the thin film encapsulation layer E that is exposed to the outside may be formed of an inorganic layer in order to prevent intrusion of moisture into the organic light-emitting device. The thin film encapsulation layer E may include at least one sandwich structure in which at least one organic layer is inserted between at least two inorganic layers. In another example, the thin film encapsulation layer E may include at least one sandwich structure in which at least one inorganic layer is inserted between at least two organic layers. In another example, the thin film encapsulation layer E may include a sandwich structure in which at least one organic layer is inserted between at least two inorganic layers and a sandwich structure in which at least one inorganic layer is inserted between at least two organic layers.

The thin film encapsulation layer E may include a first inorganic layer, a first organic layer, and a second inorganic layer sequentially formed from the top portion of the OLED 180. In another example, the thin film encapsulation layer E may include a first inorganic layer, a first organic layer, a second inorganic layer, a second organic layer, and a third inorganic layer sequentially formed from the top portion of the OLED 180. In another example, the thin film encapsulation layer E may include a first inorganic layer, a first organic layer, a second inorganic layer, a second organic layer, a third inorganic layer, a third organic layer, and a fourth inorganic layer sequentially formed from the top portion of the OLED 180. A halogenized metal layer including lithium fluoride (LiF) may be additionally included between the OLED 180 and the first inorganic layer. The halogenized metal layer may prevent the OLED 180 from being damaged when the first inorganic layer is formed in a sputtering method or a plasma deposition method.

The first organic layer may be smaller than the second inorganic layer, and the second organic layer may be smaller than the third inorganic layer.

In the meantime, a method of forming the intermediate layer 182 by using a thin film deposition apparatus will be described in detail below.

Figure 3:
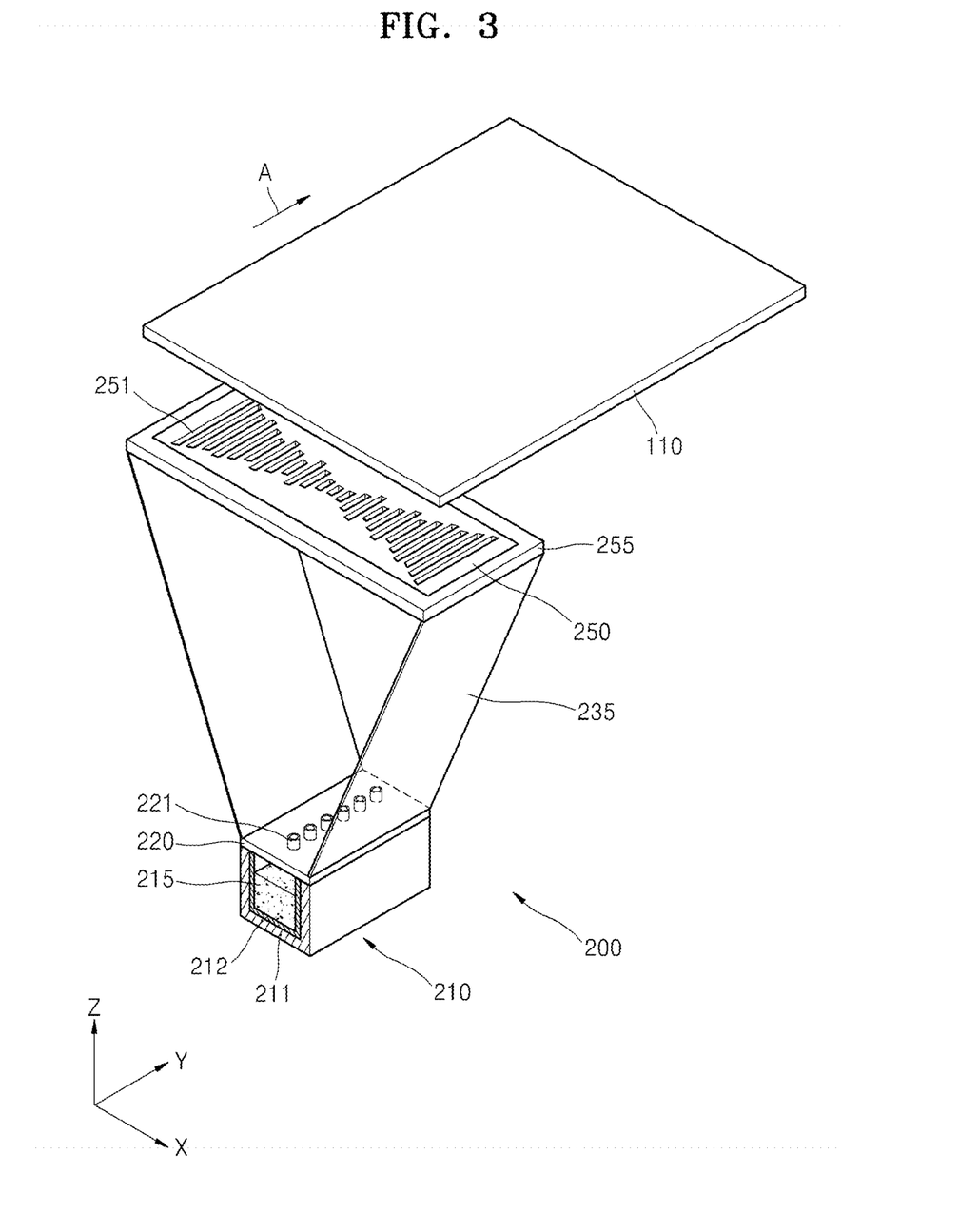
FIG. 3 is a perspective view of a thin film deposition apparatus according to an embodiment of the present invention.
Figure 4:
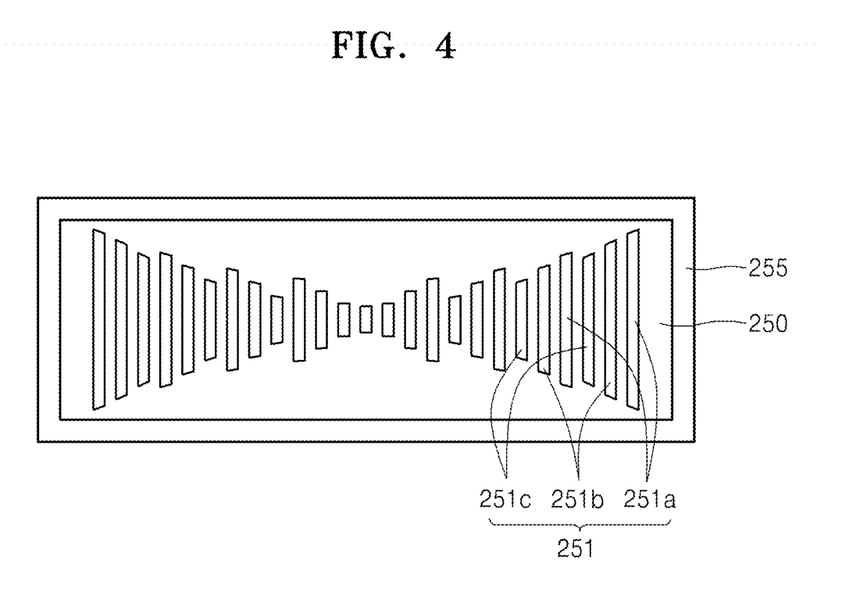
FIG. 4 is a plan view of a patterning slit sheet of FIG. 3.

FIG. 3 is a perspective view of a thin film deposition apparatus 200 according to an embodiment of the present invention. FIG. 4 is a plan view of a patterning slit sheet of FIG. 3.

Referring to FIGS. 3 and 4, the thin film deposition apparatus 200 includes a deposition source 210, a deposition source nozzle unit 220, a patterning slit sheet 250, and a connection member 235.

In this regard, all elements illustrated in FIGS. 3 and 4 may be arranged in a chamber in which an appropriate vacuum state is maintained. This is to achieve the linearity of a deposition material.

In more detail, in order to allow a deposition material 215 discharged from the deposition source 210 to pass through the deposition source nozzle unit 220 and the patterning slit sheet 250 and to be deposited on the substrate 110 as a desired pattern, the inside of a chamber basically needs to maintain the same high vacuum state as in a method of depositing a fine metal mask (FMM). Temperatures of the patterning slit sheet 250 and the connection member 235 also need to be sufficiently lower (below about 100° C.) than that of the deposition source 210 in order to maintain a high vacuum state in a space between the deposition source nozzle unit 220 and the patterning slit sheet 250. If the temperature of the patterning slit sheet 250 is sufficiently low as described above, since the deposition material 215 that is discharged in an unintended direction is absorbed onto a surface of the connection member 235 and the high vacuum state is maintained, no collision between deposition materials occurs, thereby achieving the linearity of the deposition material 215.

The substrate 110 that is a deposition target is disposed in the chamber. The substrate 110 may be a substrate for a flat panel display device. A large substrate for manufacturing a plurality of flat panel displays may be used as the substrate 110.

In this regard, a deposition process may be performed while relatively moving the substrate 110 to the thin film deposition apparatus 200.

In more detail, in a conventional deposition method using an FMM, the size of the FMM needs to be the same as that of a substrate. Thus, as the size of the substrate increases, the FMM also needs to be larger. However, it is difficult to fabricate the FMM and to align the FMM in a precise pattern by elongation of the FMM.

To address the foregoings, in the thin film deposition apparatus 200, deposition may be performed while moving the thin film deposition apparatus 200 and the substrate 110 relative to each other. In other words, deposition may be continuously performed while moving the substrate 110 which faces the thin film deposition apparatus 200 in a Y-axis direction. That is, deposition is performed in a scanning manner. Although the substrate 110 is moved in the Y-axis direction in the chamber in FIG. 3 when deposition is performed, the present invention is not limited thereto. Deposition may be performed while moving the thin film deposition apparatus 200 in the Y-axis direction while fixing the substrate 110.

Therefore, the thin film deposition apparatus 200 may form the patterning slit sheet 250 that is much smaller than that used a conventional FMM. That is, in the thin film deposition apparatus 200, since deposition is continuously performed, i.e., in a scanning manner, while moving the substrate 110 in the Y-axis direction, if a width of the patterning slit sheet 250 in an X-axis direction and a width of the substrate 110 in the X-axis direction are substantially the same, a length of the patterning slit sheet 250 in the Y-axis direction may be much less than that of the substrate 110. As described above, since the patterning slit sheet 250 may be formed much smaller than the conventional FMM, it is easy to manufacture the patterning slit sheet 250 according to embodiments of the present invention. That is, a small size of the patterning slit sheet 250 is more advantageous in all manufacturing processes, including etching followed by precise elongation, welding, transferring, and washing processes, than the method of depositing the FMM. In addition, this is more advantageous for manufacturing a relatively large display device.

As described above, in order to perform deposition while moving the thin film deposition apparatus 200 and the substrate 110 relative to each other, the thin film deposition apparatus 200 and the substrate 110 may be spaced apart from each other by a certain gap.

In the meantime, the deposition source 210 that accommodates and heats the deposition material 2115 may be disposed in the chamber at a side facing the substrate 110. As the deposition material 215 accommodated in the deposition source 2110 is vaporized, deposition may be performed on the substrate 110.

In more detail, the deposition source 210 may include a crucible 211 that is filled with the deposition material 215 and a heater 212 that heats the crucible 211 to vaporize the deposition material 215 filled in the crucible 211 toward one side of the crucible 211, in particular, toward the deposition source nozzle unit 220.

The deposition source nozzle unit 220 may be disposed at one side of the deposition source 210, particularly, facing the substrate 110. A plurality of deposition source nozzles 221 may be formed in the deposition source nozzle unit 220 in the X-axis direction. In this regard, the deposition source nozzles 221 may be formed at a same gap. The deposition material 215 vaporized in the deposition source 210 passes through the deposition source nozzle unit 220 and faces the substrate 110 that is the deposition target.

The patterning slit sheet 250 and a patterning slit sheet frame 255 may be further disposed between the deposition source 210 and the substrate 110. The patterning slit sheet frame 255 is approximately formed in a window frame shape. The patterning slit sheet 250 may be coupled to the inside of the patterning slit sheet frame 255. A plurality of patterning slits 251 may be formed in the patterning slit sheet 250 in the X-axis direction. A length of the patterning slit 251 corresponding to a deposition space may not be the same as illustrated in FIG. 3. This is to deposit the intermediate layers 182 having different thicknesses while improving uniformity of a thickness of a deposition thin film. This will be described later.

The deposition material 215 vaporized in the deposition source 210 may pass through the deposition source nozzle unit 220 and the patterning slit sheet 250 and face the substrate 110 that is the deposition target. In this regard, the patterning slit sheet 250 may be formed by using the same method as that of forming the conventional FMM, in particular, a stripe type mask, e.g., etching.

In this regard, a total number of the patterning slits 251 may be greater than that of the deposition source nozzles 221.

In the meantime, the deposition source 210 (and the deposition source nozzle unit 220 combined thereto) and the patterning slit sheet 250 may be spaced apart from each other by a certain gap, and may be connected to each other by using the connection member 235. That is, the deposition source 210, the deposition source nozzle unit 220, and the patterning slit sheet 250 may be connected to each other by using the connection member 235 to be integrally formed. In this regard, the connection member 235 may guide a movement path of a deposition material such that the deposition material discharged via the deposition source nozzle 221 is not dispersed. Although the connection member 235 is formed in left and right directions of the deposition source 210, the deposition source nozzle unit 220, and the patterning slit sheet 250 in FIG. 3, since this is for convenience of illustration, the present invention is not limited thereto. The connection member 235 may be formed in a closed box shape to simultaneously guide the deposition material to move in the X-axis and Y-axis directions.

As described above, deposition is performed while moving the thin film deposition apparatus 200 relative to the substrate 110. In order for the thin film deposition apparatus 200 to move relative to the substrate 110, the patterning slit sheet 250 is disposed spaced apart from the substrate 110 by a certain gap.

In more detail, the conventional method of depositing the FMM performs deposition with a mask in close contact with a substrate in order to prevent formation of a shadow on the substrate. However, when the mask is formed in close contact with the substrate, a defect occurs due to the contact between the substrate and the mask. In addition, since the mask may not be moved with respect to the substrate, the mask and the substrate need to be formed in the same size. Accordingly, the mask needs to be large as the size of a display device increases. However, it is difficult to form a large mask.

To address the foregoings, in the thin film deposition apparatus 200 according to an embodiment of the present invention, the patterning slit sheet 250 needs to be formed spaced apart from the substrate 110 that is the deposition target by a certain gap.

According to embodiments of the present invention, deposition may be performed while moving a mask formed smaller than the substrate with respect to the substrate, thereby facilitating manufacture of the mask. A defect due to contact between the substrate and the mask may be prevented or minimized. It is also unnecessary to take time in closely contacting the substrate with the mask during a deposition process, thereby improving a manufacturing speed.

In the meantime, the patterning slit sheet 250 may include the plurality of patterning slits 251. In this regard, the patterning slits 251 may include a first patterning slit 251a through which a deposition material for forming the first sub-pixel R passes, a second patterning slit 251b through which a deposition material for forming the second sub-pixel G passes, and a third patterning slit 251c through which a deposition material for forming the third sub-pixel B passes. In this regard, the first patterning slit 251a, the second patterning slit 251b, and the third patterning slit 251c may form one group. In particular, the deposition materials that pass through the first patterning slit 251a, the second patterning slit 251b, and the third patterning slit 251c respectively form the first sub-pixel R, the second sub-pixel G, and the third sub-pixel B, thereby forming the unit pixel P.

The deposition material may be one of various materials described above. For example, the deposition material may be one of materials for forming the organic emission layer 182d. The deposition material may be one of materials for forming the functional layers 182c. In addition, the deposition material may include all materials that may be deposited via the thin film deposition apparatus 200 onto layers forming the intermediate layers 182.

Passage areas through which the deposition material passes may be formed in the first patterning slit 251a, the second patterning slit 251b, and the third patterning slit 251c. In this regard, the passage area formed in the first patterning slit 251a may be a length of the first patterning slit 251a. The passage area formed in the second patterning slit 251b may be a length of the second patterning slit 251b. The passage area formed in the third patterning slit 251c may be a length of the third patterning slit 251c.

At least two of the lengths of the first patterning slit 251a, the second patterning slit 251b, and the third patterning slit 251c may be different from each other. For example, the length of the first patterning slit 251a may be greater than that of the second patterning slit 251b. The length of the second patterning slit 251b may be also greater than that of the third patterning slit 251c.

When the at least two of the lengths of the first patterning slit 251a, the second patterning slit 251b, and the third patterning slit 251c are different from each other, different amounts of the deposition material may pass through the first patterning slit 251a, the second patterning slit 251b, and the third patterning slit 251c. In more detail, since the length of the first patterning slit 251a is greater than that of the second patterning slit 251b, an amount of the deposition material that passes through the first patterning slit 251a may be greater than that of the deposition material that passes through the second patterning slit 251b. Also, since the length of the second patterning slit 251b may be also greater than that of the third patterning slit 251c, an amount of the deposition material that passes through the second patterning slit 251b may be also greater than that of the deposition material that passes through the third patterning slit 251c. In this regard, the lengths of the first patterning slit 251a, the second patterning slit 251b, and the third patterning slit 251c may be formed such that the greatest amount of the deposition material passes through the first patterning slit 251a, and the second largest amount of the deposition material passes through the second patterning slit 251b, and the smallest amount of the deposition material passes through the third patterning slit 251c.

In the meantime, the first patterning slit 251a, the second patterning slit 251b, and the third patterning slit 251c may form a group as described above and may be included in the patterning slit sheet 250. In this regard, gaps between the first patterning slit 251a, the second patterning slit 251b, and the third patterning slit 251c may be the same. A plurality of each of the first patterning slit 251a, the second patterning slit 251b, and the third patterning slit 251c may be provided.

At least one of both ends of the plurality of first patterning slits 251a may be formed in an arcuate or cosine curve shape. For example, the plurality of first patterning slits 251a may have different lengths, and lengths y of the first patterning slits 251a may be increased from a center (x=0) to the outside.

In more detail, the farther away from the center of the patterning slit sheet 250, the greater the lengths of the first patterning slits 251a. That is, the length of the first patterning slit 251a that is the closest to the center of the patterning slit sheet 250 may be the smallest among the lengths of the plurality of first patterning slits 251a formed in the patterning slit sheet 250, and the farther away from the first patterning slit 251a that is the closest to the center of the patterning slit sheet 250, the greater the length of the first patterning slit 251a.

As described above, the mask having the first patterning slits 251a may function to block a part of the deposition material from the deposition source nozzles 221 (see FIG. 3) to the patterning slit sheet 250. In more detail, a deposition film deposited by the thin film deposition apparatus 200 has a center portion in a convex shape, and thus a part of the deposition material toward the center portion needs to be blocked to make the center portion uniform. Thus, the part of the deposition material may be blocked by forming different lengths of the first patterning slits 251a. In this regard, since the patterning slit sheet 250 is formed in such a way that lengths of the first patterning slits 251a may be increased from a center portion of the deposition space S toward both end portions thereof, a small amount of the deposition material passes through the first patterning slit 251a corresponding to the center portion having a relatively small length, and a great amount of the deposition material passes through the first patterning slit 251a corresponding to an end portion of the patterning slit sheet 250 having a relatively great length. In this case, different lengths of the first patterning slits 251a may be generally formed such that film thicknesses of both end portions of the patterning slit sheet 250 may be an entire film thickness.

As such, the deposition film deposited by the thin film deposition apparatus 200 may be corrected to have a uniform shape by forming the first patterning slits 251a to have different lengths. That is, the amount of the deposition material may be adjusted so that the thickness of the deposition material is uniform. The adjustment may be made by enabling a small amount of the deposition material to pass through patterning slit by reducing the lengths of patterning slits on which a large amount of the deposition material is deposited and increasing the lengths of the patterning slits on which a small amount of the deposition material is deposited.

Therefore, uniformity of a thin film deposited on a substrate by using the first patterning slits 251a is formed within the error range of about 1%~2%, thereby improving product quality and reliability.

The above phenomenon may be the same as or similar to that in the second patterning slit 251b and the third patterning slit 251c. Thus, lengths of the second patterning slit 251b and the third patterning slit 251c may be formed to be similar to that of the first patterning slit 251a. In this regard, curvature radii or cosine values of the first patterning slit 251a, the second patterning slit 251b, and the third patterning slit 251c may be differently formed as described above.

In the meantime, upon reviewing a method of forming the intermediate layer 182 by using the thin film deposition apparatus 200 described above, each layer may be formed on the substrate 110, the HIL 182a and the HTL 182b may be formed on the pixel electrode 181, and then the substrate 110 may be injected into a chamber. Thereafter, the deposition material may be deposited on the substrate 110 via the patterning slit sheet 250 while moving the substrate 110 in a direction A of FIG. 3.

When the deposition material passes through the first patterning slit 251a, the second patterning slit 251b, and the third patterning slit 251c, a thickness of the functional layer 182c may be different. In particular, in this case, the thickness of the functional layer 182c in which the first organic emission layer 182d-R is to be formed may be the largest, the thickness of the functional layer 182c in which the second organic emission layer 182d-G is to be formed may be the second largest, and the thickness of the functional layer 182c in which the third organic emission layer 182d-B is to be formed may be the smallest. The thickness of the functional layer 182c in which the first organic emission layer 182d-R is to be formed, formed by the patterning slit sheet 250, is the same over an entire area of the patterning slit sheet 250, and the thickness of the functional layer 182c in which the second organic emission layer 182d-G is to be formed and the thickness of the functional layer 182c in which the third organic emission layer 182d-B is to be formed may also be the same over the entire area of the patterning slit sheet 250.

If the functional layers 182c of the first through third sub-pixels R, G, and B are formed as described above, the first organic emission layer 182d-R, the second organic emission layer 182d-G, and the third organic emission layer 182d-B may be formed. In this regard, the first organic emission layer 182d-R, the second organic emission layer 182d-G, and the third organic emission layer 182d-B may use different masks, and a deposition method thereof may be similar to the method of forming the functional layers 182c.

Thereafter, other layers such as the ETL 182e and the EIL 182f may be stacked on the organic emission layers 182d, thereby manufacturing the organic light-emitting display apparatus 100.

When the organic light-emitting display apparatus 100 is manufactured by using the thin film deposition apparatus 200 as described above, an optical thickness of each of the organic emission layers 182d may be corrected. In particular, a thickness of the intermediate layer 182 according to locations of the organic emission layers 182d may be achieved by a simple and quick manufacture process.

Figure 5:
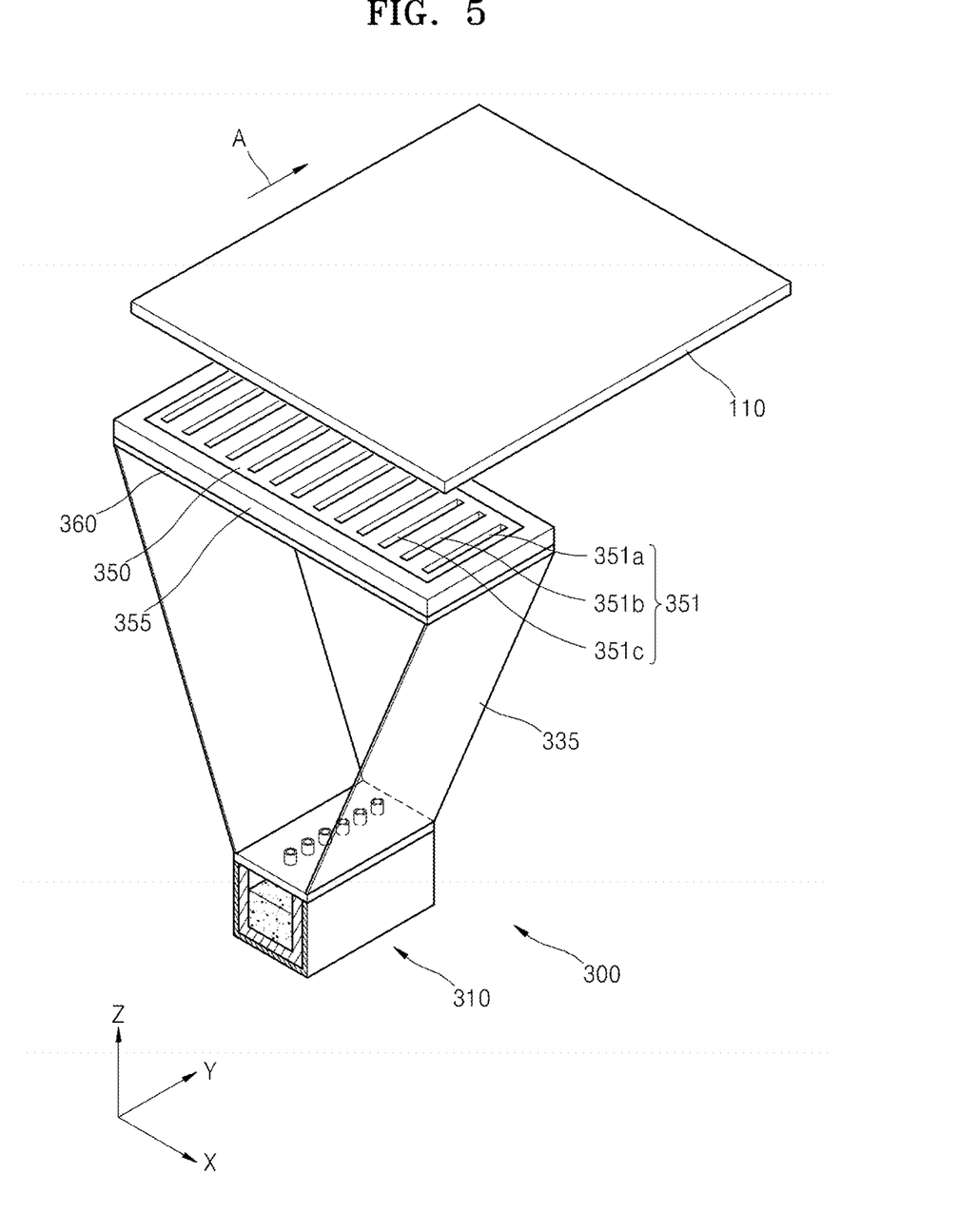
FIG. 5 is a perspective view of a thin film deposition apparatus according to another embodiment of the present invention.
Figure 6:
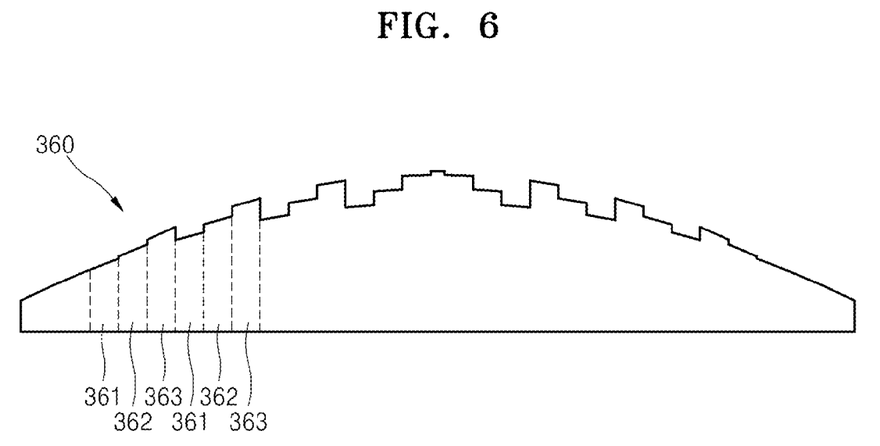
FIG. 6 is a plan view of a correction plate of FIG. 5.

FIG. 5 is a perspective view of a thin film deposition apparatus 300 according to another embodiment of the present invention. FIG. 6 is a plan view of a correction plate 360 of FIG. 5.

Referring to FIGS. 5 and 6, the thin film deposition apparatus 300 may include a deposition source 310, a deposition source nozzle unit 320, a patterning slit sheet 350, a connection member 335, and the correction plate 360. In this regard, the deposition source 310, the deposition source nozzle unit 320, and the connection member 335 are the same as or similar to those described above, and thus detailed descriptions thereof are omitted.

The patterning slit sheet 350 may be installed on a patterning slit sheet frame 355. In this regard, the patterning slit sheet frame 355 is the same as or similar to that described above, and thus a detailed description thereof is omitted.

The patterning slit sheet 350 may include a plurality of patterning slits 351. In this regard, the patterning slits 351 may be formed in the same size. The patterning slits 351 may be spaced apart from each other.

Each of the patterning slits 351 may include a first patterning slit 351a, a second patterning slit 351b, and a third patterning slit 351c that are formed corresponding to the first sub-pixel R, the second sub-pixel G, and the third sub-pixel B, respectively.

The correction plate 360 may be installed in a top surface or a bottom surface of the patterning slit sheet 350 to shield at least a part of the patterning slit 351. In this regard, the correction plate 360 may define a passage area of the first patterning slit 351a, a passage area of the second patterning slit 351b, and a passage area of the third patterning slit 351c by shielding the at least a part of the patterning slit 351.

In more detail, the correction plate 360 may include a first patterning slit shield unit 361 that shields at least a part of the first patterning slit 351a to define the passage area of the first patterning slit 351a. The correction plate 360 may include a second patterning slit shield unit 362 that defines the passage area of the second patterning slit 351b and a third patterning slit shield unit 363 that defines the passage area of the third patterning slit 351c.

In this regard, the first patterning slit shield unit 361, the second patterning slit shield unit 362, and the third patterning slit shield unit 363 may differently form at least two of lengths of the passage areas of the first patterning slit 351a, the second patterning slit 351b, and the third patterning slit 351c. The first patterning slit shield unit 361, the second patterning slit shield unit 362, and the third patterning slit shield unit 363 may form the passage areas of the first patterning slit 351a, the second patterning slit 351b, and the third patterning slit 351c such that the first patterning slit 351a, the second patterning slit 351b, and the third patterning slit 351c may be the same as the first patterning slit 251a, the second patterning slit 251b, and the third patterning slit 251c described with reference to FIGS. 3 and 4 above by shielding the first patterning slit 351a, the second patterning slit 351b, and the third patterning slit 351c.

The first patterning slit shield unit 361, the second patterning slit shield unit 362, and the third patterning slit shield unit 363 may form one group: A plurality of groups may be connected such that the groups may correspond to a length of the patterning slit sheet 350.

In particular, a plurality of first patterning slit shield units 361 may be provided and may have lengths that are reduced from a center of the patterning slit sheet 350 to the outside. In particular, outer surfaces of the first patterning slit shield units 361 may be formed in a circular arc or cosine shape.

The second patterning slit shield unit 362 and the third patterning slit shield unit 363 may be formed to be similar to the first patterning slit shield units 361. In this regard, a length of the second patterning slit shield unit 362 may be greater than that of the first patterning slit shield units 361, and a length of the third patterning slit shield unit 363 may be greater than that of the second patterning slit shield unit 362. Thus, the passage area of the first patterning slit 351a may be greater than that of the second patterning slit 351b, and the passage area of the second patterning slit 351b may be greater than that of the third patterning slit 351c.

In the meantime, a method of forming the intermediate layer 182 by using the thin film deposition apparatus 300 formed as described above may be similar to that described above. In more detail, the substrate 110 is injected into a chamber so as to allow the thin film deposition apparatus 300 to be spaced apart from the substrate 110 and then is scanned in one direction to deposit a deposition material. In this regard, various layers may be previously formed on the substrate 110 as described above.

When the deposition material is deposited as described above, an amount of the deposition material that passes through the first patterning slit 351a, the second patterning slit 351b, and the third patterning slit 351c may be different as described above. In this regard, the functional layer 182c in which the first organic emission layer 182d-R that is red may be deposited to have the greatest thickness, the functional layer 182c in which the second organic emission layer 182d-G that is green may be deposited to have a middle thickness, and the functional layer 182c in which the third organic emission layer 182d-B that is blue may be deposited to have the smallest thickness.

The thicknesses of functional layers 182c of the first sub-pixel R, the second sub-pixel G, and the third sub-pixel B are differently formed and then, the organic emission layers 182d, the ETL 182e, the EIL 182f, and the facing electrode 183 may be sequentially formed. Thereafter, the thin film encapsulation layer E may be formed on the facing electrode 183, thereby completely manufacturing the organic light-emitting display apparatus 100.

Therefore, the thin film deposition apparatus 200 and the method of manufacturing the organic light-emitting display apparatus 100 using the thin film deposition apparatus 200 do not use a separate mask to form the functional layers 182c, thereby reducing manufacturing time and cost.

Furthermore, the thin film deposition apparatus 200 and the method of manufacturing the organic light-emitting display apparatus 100 using the thin film deposition apparatus 200 may uniformly form the intermediate layer 182 in each of sub-pixels in an entire area of the organic light-emitting display apparatus 100, thereby securing product quality and reliability.

As described above, according to the one or more of the above embodiments of the present invention, a thin film deposition apparatus and a method of manufacturing an organic light-emitting display apparatus by using the thin film deposition apparatus improve productivity.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing an organic light-emitting display device, the method comprising:
   providing a thin film deposition apparatus;
   positioning a substrate such that the substrate is spaced apart from the thin film deposition apparatus; and
   depositing a deposition material onto the substrate by discharging the deposition material from the thin film deposition apparatus onto the substrate while moving one of the thin film deposition apparatus or the substrate relative to the other along a moving direction,
   wherein the depositing of the deposition material discharged from the thin film deposition apparatus onto the substrate comprises: depositing the deposition material through a plurality of patterning slits onto the substrate to form a plurality of sub-pixels, each of which corresponds to one of the plurality of patterning slits,
   wherein the plurality of patterning slits comprise a first patterning slit through which the deposition material passes for forming a first one of the plurality of sub-pixels, a second patterning slit through which the deposition material passes for forming a second one of the plurality of sub-pixels, and a third patterning slit through which the deposition material passes for forming a third one of the plurality of sub-pixels,
   wherein the first patterning slit has a first length extending along the moving direction, and the second patterning slit has a second length extending along the moving direction and substantially different from the first length, and
   wherein the first, second and third patterning slits are arranged to be spaced apart from each other.

2. The method of claim 1, wherein the first sub-pixel comprises an intermediate layer comprising an organic emission layer that is configured to emit red light, the second sub-pixel comprises an intermediate layer comprising an organic emission layer that is configured to emit green light, and the third sub-pixel comprises an intermediate layer comprising an organic emission layer that is configured to emit blue light.

3. The method of claim 2, wherein the third patterning slit has a third length extending along the moving direction, wherein the first length is greater than the second length which is greater than the third length.

4. A method of manufacturing an organic light-emitting display device, the method comprising:
   providing a thin film deposition apparatus;
   positioning a substrate such that the substrate is spaced apart from the thin film deposition apparatus; and
   depositing a deposition material onto the substrate by discharging the deposition material from the thin film deposition apparatus onto the substrate while moving one of the thin film deposition apparatus or the substrate relative to the other along a moving direction,
   wherein the depositing of the deposition material discharged from the thin film deposition apparatus onto the substrate comprises: depositing the deposition material through a plurality of patterning slits onto the substrate to form a plurality of sub-pixels, each of which corresponds to one of the plurality of patterning slits,
   wherein the plurality of patterning slits comprise a first patterning slit through which the deposition material passes for forming a first one of the plurality of sub-pixels, a second patterning slit through which the deposition material passes for forming a second one of the plurality of sub-pixels, and a third patterning slit through which the deposition material passes for forming a third one of the plurality sub-pixels, wherein the first patterning slit has a first length extending along the moving direction, and the second patterning slit has a second length extending along the moving direction and substantially different from the first length, wherein the plurality of patterning slits comprises an additional first patterning slit for forming another first subpixel, an additional second patterning slit for forming another second subpixel, and an additional third patterning slit for forming another third subpixel, and wherein the first, second and third patterning slits are located closer to a center of a patterning slit sheet comprising the plurality of patterning slits than the additional first, second and third patterning slits, respectively, and the first, second and third patterning slits are shorter than the additional first, second and third patterning slits, respectively.

5. The method of claim 1, wherein an amount of the deposition materials deposited on the substrate is controlled according to the length of each of the first through third patterning slits.

* * * * *